United States Patent [19]

Rinaldis

[11] Patent Number: 4,905,238
[45] Date of Patent: Feb. 27, 1990

[54] ANALOG AMPLIFIER-MULTIPLEXER FOR A DATA SYSTEM

[75] Inventor: Joseph M. Rinaldis, Colorado Springs, Colo.

[73] Assignee: Digital Equipment Corporation, Maynard, Mass.

[21] Appl. No.: 93,196

[22] Filed: Sep. 4, 1987

[51] Int. Cl.⁴ .............................................. H04J 3/02
[52] U.S. Cl. .................................... 370/112; 307/243
[58] Field of Search ................. 370/112, 113; 330/252, 330/295, 296, 307; 328/154, 104; 307/243

[56] References Cited

U.S. PATENT DOCUMENTS

| | | | |
|---|---|---|---|
| 3,213,290 | 10/1965 | Klein et al. | 307/243 |
| 3,594,590 | 7/1971 | Smith | 328/154 |
| 3,601,634 | 8/1971 | Ebertin et al. | 370/112 |
| 3,716,727 | 2/1973 | Stehlin et al. | 307/243 |
| 4,146,750 | 3/1979 | Spiesman | 370/112 |
| 4,591,740 | 5/1986 | Anderson et al. | 307/243 |
| 4,755,765 | 7/1988 | Ferland | 328/154 |

*Primary Examiner*—Douglas W. Olms
*Assistant Examiner*—Melvin Maralo
*Attorney, Agent, or Firm*—Kenyon & Kenyon

[57] ABSTRACT

An analog amplifier multiplexer for a data system in which a plurality of differential signal channels are multiplexed onto a pair of differential signal lines includes a differential amplifier connected to each pair of differential signal lines which are to be multiplexed and a current switch connected to each differential amplifier which ensures that an individual differential amplifier will amplify the differential signal applied to it only when it is selected to do so by a selection signal. The selection signal and the current switch ensure that only one differential amplifier amplifies its corresponding differential signal and supplies it to an additional circuitry at any one time.

7 Claims, 3 Drawing Sheets

ANALOG AMPLIFIER-MULTIPLEXER FOR A DATA SYSTEM

BACKGROUND OF THE INVENTION

1. Field of the Invention

The present invention relates to a multiplexer in a data system. More particularly, the present invention relates to an analog amplifier-multiplexer utilized for a read channel in a data system.

2. Related Art

In a data processing system, it is sometimes necessary to multiplex a plurality of data lines onto a single data transmission line. For example, FIG. 1(a) illustrates a portion of a data system in which such multiplexing is necessary. In FIG. 1(a), there are a plurality of read channel lines 11. Each read channel line 11 is connected to a transducer head (not shown) for reading data from a recording medium. Such a recording medium may be a magnetic disk, magnetic tape, optical disk or other such media. A plurality of these read channel lines 11 are inputs to a pre-amplifier 12. In the example shown in FIG. 1(a) there are 13 read channel lines however, a greater or lesser number of read channels may be utilized. If for example each pre-amplifier 12 can interface with four read channel lines 11 as inputs then a minimum of four pre-amplifiers 12 are necessary for the exemplary system. Each pre-amplifier 12 has as an output a pair of differential signal lines 14. It is necessary that the four pairs of differential signal lines from the pre-amplifiers 12 of FIG. 1(a) be reduced to a single pair of differential signal lines for purposes of inputting the data signals appearing on all of those differential signal lines into a portion of the system that constitutes additional read circuitry of the data system.

One possible solution would be to tie together the four pairs of differential lines 14 so as to produce one pair of differential lines. This alternative has many disadvantages, one of the disadvantages being an introduction of different levels of noise due to the necessity of each pair of differential lines being of a different length so that they can all be joined together. In addition, if this solution is used there is no amplification provided to the data signals on the lines and there is no true multiplexing of the data signals for creating an input to the additional read circuitry.

A second solution is to provide a plurality of FET switches which are turned on and off by a logic signal. This set of switches acts as an analog multiplexer and can multiplex four pairs of differential signal lines down to one pair of differential signal lines. A commercially available device, the Harris HI-509L consists of a simple pair of FET switches that are turned on and off by a logic signal. Available units have no specification for bandwidth, or common mode rejection and there is no gain. It is believed that none of the commercial parts have high bandwidth, high common mode rejection and gain in a single package.

Therefore, previously available means for multiplexing a plurality of pairs of differential signal lines down to a single pair of differential signal lines do not have characteristics which are desirable for providing an amplified-multiplexed signal to additional read circuitry. Known multiplexers used in this environment do not have suitable gain capabilities, do not have high bandwidth and do not have high common mode rejection characteristics.

SUMMARY OF THE INVENTION

The amplifier-multiplexer of the present invention, obviates the above described disadvantages of known analog multiplexers by including:

(a) means for amplifying each one of a plurality of data signals, the means for amplifying being coupled to a plurality of differential signal lines and an output coupled to an output channel and (b) means for activating said means for amplifying to amplify one of said data signals and to cause the amplified data signal to be an output to the output channel.

The means for activating may comprise a means for introducing a select signal where the select signal corresponds to a particular one of the plurality of data signals appearing on the differential signal lines; means for producing a bias signal; and a switching means responsive to the bias signal and the select signal for providing an activation signal to said means for amplifying so as to cause the amplification and output to the output channel of the data signal corresponding to the select signal.

In the present invention the means for amplifying may constitute a plurality of differential amplifiers. The means for amplifying may include a plurality of differential amplifiers where the number of differential amplifiers equals the number of pairs of differential signal lines being input to the amplifier multiplexer. The means for activating may comprise a switching device which is connected to each of the amplifiers of the means for amplifying, where the switching device activates the amplifier to which it is attached when it receives a bias signal and a select signal. The select signal corresponds to the pair of differential signal lines that carries the signal which is to be amplified.

BRIEF DESCRIPTION OF THE DRAWINGS

The present invention will be described in greater detail below, with reference to the drawings in which.

FIG. (a) is a schematic diagram of an environment in which an amplifier-multiplexer of the present invention may be disposed.

DETAILED DESCRIPTION

Like elements bear like numerals throughout the figures.

Figure 1A:
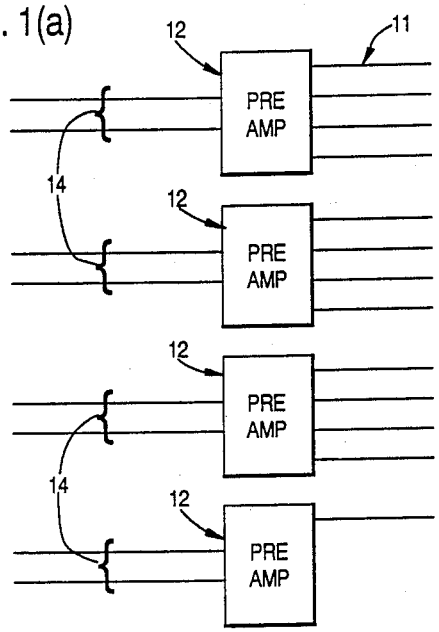
FIG. 1(b) is a schematic diagram of a read channel multiplexing system in which an embodiment of an amplifier-multiplexer of the present invention is implemented.
Figure 1B:
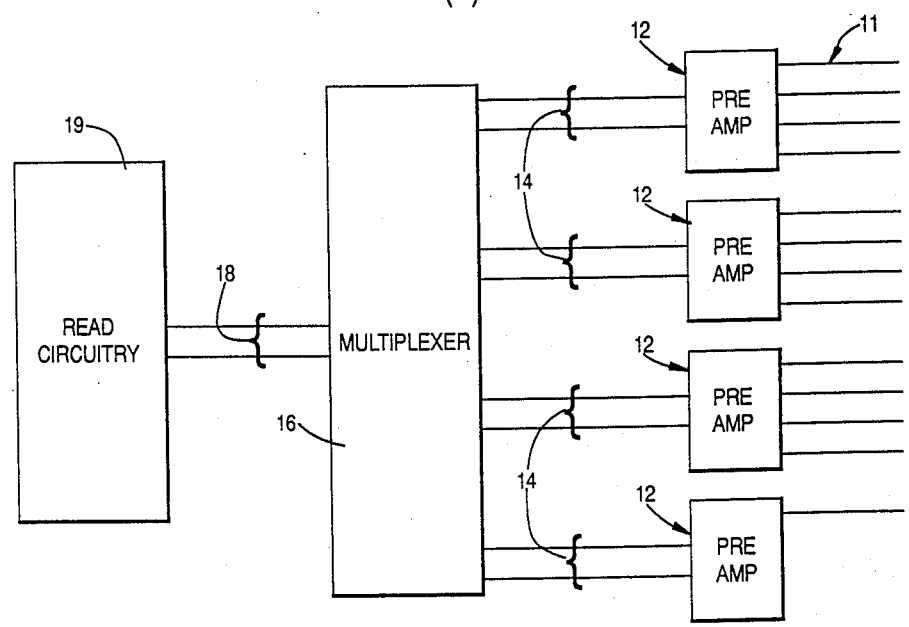

FIG. 1(b) illustrates a multiplexing system in which an amplifier-multiplexer according to the present invention is disposed. An amplifier-multiplexer of the present invention is disposed as element 16 which multiplexes and amplifies analog data signals it receives from a plurality of pairs of differential signal lines 14 onto an output channel composed of a pair of differential signal lines 18. The output channel is connected to additional read circuitry 19.

Figure 2:
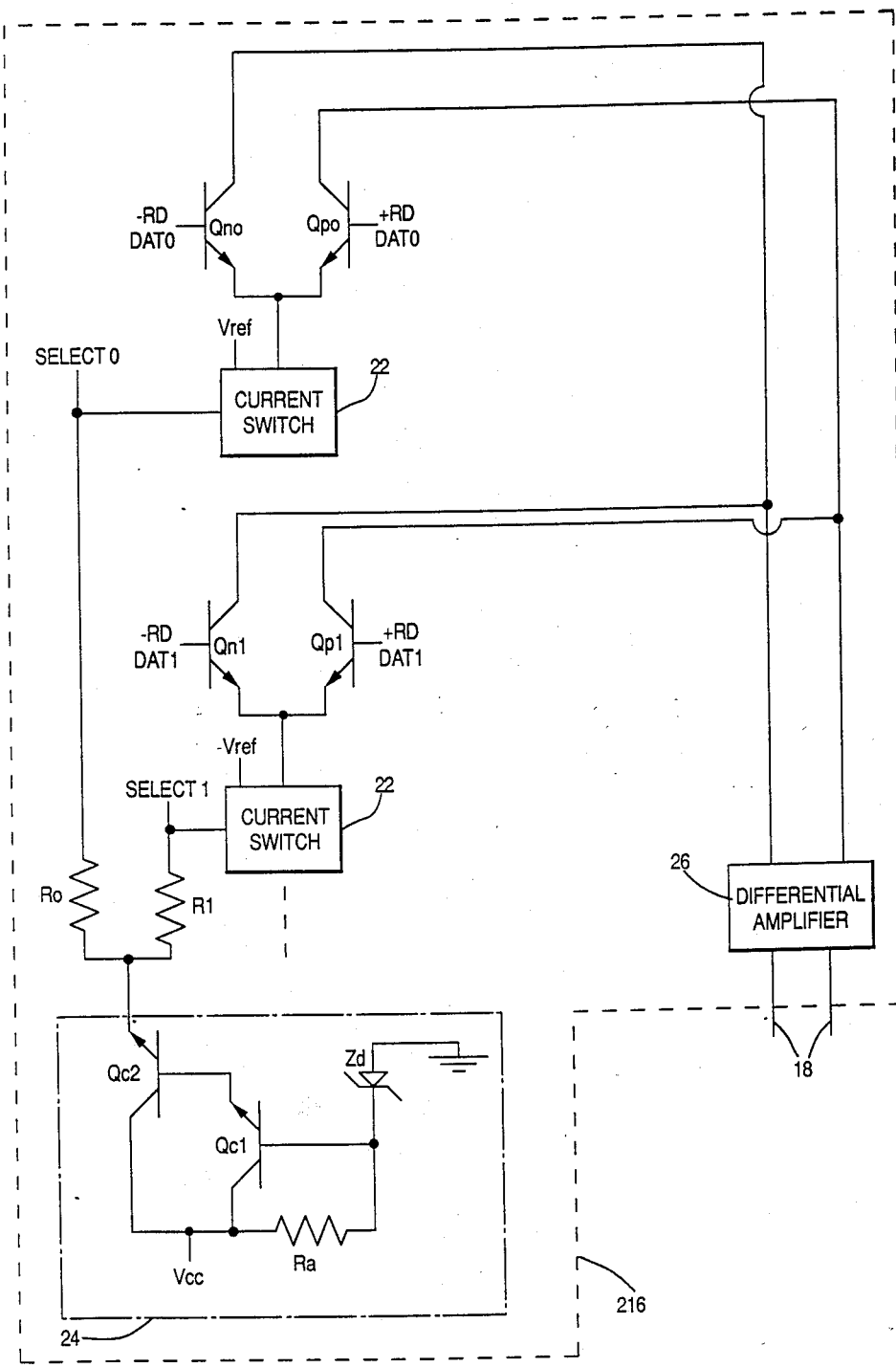
FIG. 2 is a schematic diagram of an embodiment of an amplifier-multiplexer of the present invention.

FIG. 2 illustrates an embodiment of an amplifier multiplexer of the present invention. This amplifier-multiplexer of FIG. 2 may be used as element 16 of FIG. 1(b).

In the embodiment of the amplifier-multiplexer illustrated as element 216 of FIG. 2 there are two differential amplifiers each composed of two transistors. A first differential amplifier is composed of transistors $Q_{N0}$ and $Q_{P0}$ which have their emitters connected together. The input to the base of transistor $Q_{N0}$ is signal -RD DAT0. The input to the base of transistor $Q_{P0}$ is +RD DAT0. These two analog input signals together constitute a differential signal which comes to the amplifier-multiplexer 216 from one of the pre-amps 12 of FIG. 1(b) along one of the pairs of differential signal lines 14. The collector of transistor $Q_{N0}$ is connected to a first input of a differential amplifier 26 while the collector of transistor $Q_{P0}$ is connected to a second input of the differential amplifier 26. An emitter-follower circuit (not shown) located in the differential amplifier 26 drives the output lines 18 to the read circuitry.

As stated before, the emitters of $Q_{N0}$ and $Q_{P0}$ are connected to one another. The emitters are also connected to a current switch 22.

There are two inputs to current switch 22. There is an input of a signal $V_{ref}$ and a second input influenced by the line designated "select 0".

A second pair of differential signal lines are connected to a second differential amplifier which comprises transistors $Q_{N1}$ and $Q_{P1}$. A second pair of differential signal lines carries analog signal -RD DAT1 to the base of transistor $Q_{N1}$ and analog +RD DAT1 to the base of transistor $Q_{P1}$. As with the first differential amplifier, this second differential amplifier of $Q_{N1}$ and $Q_{P1}$ comprises a connection of the emitters of the two transistors which comprise the amplifier. The collector of $Q_{N1}$ is connected to the same input of the differential amplifier 26 as the collector of $Q_{N0}$ while the collector of $Q_{P1}$ is connected to the same input of the differential amplifier 26 as the collector $Q_{P0}$ This second differential amplifier is also connected to a current switch 22 that has two inputs. The inputs are $V_{ref}$ and a signal influenced by line designated "select 1".

In the amplifier-multiplexer of the present invention for multiplexing four pairs of differential signal lines onto one differential signal line as illustrated in FIG. 1(b), two additional differential amplifiers could be added to the circuitry illustrated in FIG. 2. These two differential amplifiers could have identical transistor configurations, that is a pair of transistors with emitters connected to one another, one transistor receiving at its base a negative signal while the other transistor receiving at its base a positive signal. The transistors could have collector outputs to corresponding inputs of differential amplifier 26 and each amplifier could be attached to a current switch 22.

Element 24 illustrates a current source for the current switches of the amplifier-multiplexer 216 of FIG. 2.

A Zener diode Z is connected between the base of a transistor $Q_{C1}$ and a reference potential or ground. The emitter of transistor $Q_{C1}$ is connected to the base of a transistor $Q_{C2}$. The two transistors $Q_{C1}$ and $Q_{C2}$ are arranged to have their collectors connected to one another and to power supply $V_{cc}$. A resistance Ra is connected between the collector and base of transistor $Q_{C1}$. The emitter of $Q_{C2}$ is connected to the first end of resistor $R_o$ whose second end is connected to the "select 0" line and is connected to the current switch 22 that is connected to the first differential amplifier comprising transistors $Q_{N0}$ and $Q_{P0}$. The emitter for transistor $Q_{C2}$ is also connected to a first end of resistor $R_1$ which has at its second end a connection to "select 1" line and to the current switch 22 connected to the second differential amplifier comprising transistors $Q_{N1}$ and $Q_{P1}$. Additional resistances and select lines would be present for an amplifier-multiplexer utilizing four differential amplifiers as described above. There would be additional select lines "select 2" and "select 3". There would also be additional resistances $R_2$ and $R_3$ connected to the emitter of transistor $Q_{C2}$.

Figure 3:
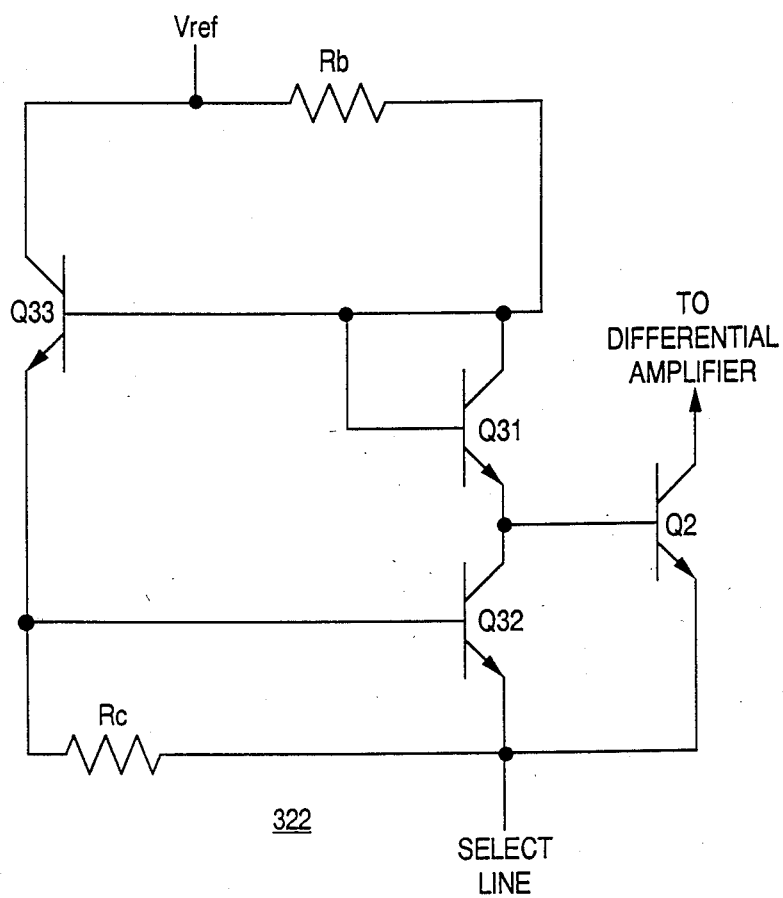
FIG. 3 is an embodiment for one of the elements of the embodiment of the present invention which is illustrated in FIG. 2.

FIG. 3 illustrates an embodiment of the current switch 22 of FIG. 2.

The collector of a transistor $Q_2$ is connected to the connected emitters of the differential transistor pair to which this current switch attaches. For example, if this current switch were disposed as the current switch for the differential amplifier comprising transistors $Q_{N0}$ and $Q_{P0}$, the collector of transistor $Q_2$ would be connected to the emitters of transistors $Q_{N0}$ and $Q_{P0}$. The base of transistor $Q_2$ is connected to the emitter of a transistor $Q_{31}$ and the collector of a transistor $Q_{32}$. Transistors $Q_2$ and $Q_{32}$ have their emitters connected together and connected to the select line for that particular current switch. For example, if this current switch was being utilized with transistor pair $Q_{N0}$ and $Q_{P0}$ then the select line connected to the emitter of transistors $Q_2$ and $Q_{32}$ would be the line "select 0".

Resistance $R_C$ is connected between the base of transistor $Q_{32}$ and the emitter of $Q_{32}$. The base of transistor $Q_{32}$ is connected to the emitter for a transistor $Q_{33}$. The collector of transistor $Q_{33}$ is connected to the other input of the current switch $V_{ref}$ as illustrated in FIG. 2. Resistance $R_b$ is connected between the collector and the base of transistor $Q_{33}$. The base of transistor $Q_{33}$ is connected to the base and collector of transistor $Q_{31}$.

In operation, when a select line, for example "select 0", is chosen the line is made low and current then flows through the current switch that is connected to the differential amplifier composed of transistors $Q_{N0}$ and $Q_{P0}$. When transistor $Q_2$ of the switch is turned on as a result of the selected line being low, the differential amplifier pair $Q_{N0}$ and $Q_{P0}$ for example, amplify the difference between the input analog signals +RD DAT0 and -RD DAT0.

The current switches and the current sources for the switches for each of the differential amplifiers operate in the same manner.

The current source 24 of FIG. 2 together with the select lines operate to insure that only one differential amplifier is allowed to amplify a differential signal from one pair of differential signal lines at a time and the amplified signal is an output to the differential amplifier 26. There may be circuitry, not shown in the figures, that ensures that the selection of a particular multiplexer channel select line is mutually exclusive with the selection of other channel select lines, that is such circuitry ensures that only one select line for example "select 0" may be low or selected at any one particular time.

The present invention may be fabricated into a single chip with a layout which is specifically designed to improve common mode rejection.

The design of the amplifier-multiplexer is not limited to the use of all npn bipolar junction transistors. One skilled in the art would be able to construct an equivalent embodiment of the present invention from other transistor configurations.

In a system utilizing four differential amplifiers for multiplexing four pairs of differential signal lines on to one pair of differential signal lines, the amplifier-multiplexer of the present invention provides a gain of about 1.8 based on the transistor configuration. It operates with a bandwidth of 50 megahertz. In addition, the design provides for high common mode rejection.

Therefore, the instant design of an amplifier-multiplexer results in a multiplexing of differential signal lines in such a manner as to provide gain, high bandwidth and high common mode rejection which is not obtainable with available analog multiplexers; the design is not limited to multiplexing four pairs of differential signal lines onto a single pair of differential signal lines. This is merely representative of one embodiment of the present invention.

Additionally, the present invention is not to be limited to use in read channel circuitry of a data system but may have additional applications where amplified-multiplexing would be advantageous.

What is claimed is:

1. In a data system including a plurality of differential signal lines, each carrying a data signal, and an output channel, a multiplexer comprising:

means for differentially amplifying said data signals having a plurality of inputs coupled to said plurality of differential signal lines and an output coupled to the output channel;

means for activating said means for differentially amplifying to selectively amplify in response to select signals one of said data signals and to cause the amplified data signal to be an output to the output channel;

means for introducing a select signal said select signal corresponding to a particular one of said plurality of data signals;

means for producing a bias signal; and means for switching, responsive to said bias signal and said select signal, for producing as an output an activation signal, said output of said means for switching being coupled to said means for amplifying, wherein said means for switching includes a current switch coupled to the means for differentially amplifying, the current switch including: a first transistor having a collector coupled to a reference voltage, an emitter and a base; a second transmitter having a base coupled to the emitter of the first transistor, a collector and an emitter; a third transistor having a base and a collector, each of which are coupled to the base of the first transistor, and an emitter coupled to the collector of the second transistor, and a fourth transistor having a base coupled to the emitter of the second transistor, and a collector coupled to the means for differentially amplifying, with the emitters of the second and fourth transistors receiving said select signals, and the emitter of the fourth transistor providing an activation signal in response to said reference voltage and said select signals.

2. The multiplexer of claim 1 wherein said means for differentially amplifying comprises a plurality of differential amplifiers.

3. In a data system having n pairs of differential signal lines, each pair of differential signal lines carrying a differential data signal, and an output channel including a pair of differential signal lines, a multiplexer comprising:

means for differentially amplifying each of said data signals, coupled to said plurality of differential signal lines and to the output channel;

means for activating said means for amplifying to selectively amplify in response to select signals one of said data signals and to cause the amplified data signal to be an output to the output channel;

means for introducing n select signals;

means for providing a plurality of bias signals; and a plurality of switches, each switch connected to one of said n differential amplifiers, each of said switches being responsive to one of each select signals and to one of said bias signals wherein each of said switch provides an activation signal to a particular one of said n differential amplifiers when it receives said bias signal and a select signal corresponding to a data signal to be amplified; each said switch being a current switch coupled to the means for differentially amplifying, the current switch including: a first transistor having a collector coupled to a reference voltage, an emitter and a base; a second transmitter having a base coupled to the emitter of the first transistor, a collector and an emitter; a third transistor having a base and a collector, each of which are coupled to the base of the first transistor, and an emitter coupled to the collector of the second transistor; and a fourth transistor having a base coupled to the emitter of the second transistor, and a collector coupled to the means for differentially amplifying, with the emitters of the second and fourth transistors receiving said select signals, and the emitter of the fourth transistor providing an activation signal in response to said reference voltage and said select signals.

4. The multiplexer of claim 3 wherein said means for differentially amplifying comprises n differential amplifiers, each differential amplifier corresponding to one of said n pairs of differential signal lines, each of said differential amplifiers having a pair of differential output lines coupled to the pair of differential lines of the output channel.

5. A multiplexer on a single chip having high bandwidth, high common mode rejection and gain comprising:

means for receiving a plurality of pairs of differential signals;

means for selectively amplifying in response to select signals one of said plurality of pairs of differential signals, connected to said means for receiving;

means for coupling said one of said amplified pairs of differential signals to an output line;

means for producing a bias signal; and means for switching, responsive to said bias signal and said select signal, for producing as an output an activation signal, said output of said means for switching being coupled to said means for selectively amplifying; wherein the means for switching includes a current switch coupled to the means for selectively amplifying, the current switch including: a first transistor having a collector coupled to a reference voltage, an emitter and a base; a second transmitter having a base coupled to the emitter of the first transistor, a collector and an emitter; a third transistor having a base and a collector, each of which are coupled to the base of the first transistor, and an emitter coupled to the collector of the second transistor; and a fourth transistor having a base coupled to the emitter of the second transistor, and a collector coupled to the means for differentially amplifying, with the emitters of the second and fourth transistors receiving said select signals, and the emitter of the fourth transistor providing an activation signal in response to said reference voltage and said select signals.

6. The multiplexer of claim 5 wherein said means for coupling comprises:
  means for introducing a select signal, said select signal corresponding to a particular one of said plurality of data signals;
  means for producing a bias signal; and
  means for switching, responsive to said bias signal and said select signal, for producing as an output an activation signal, said output of said means for switching being coupled to said means for selectively amplifying.

7. The multiplexer of claim 5 wherein said means for selectively amplifying in response to select signals comprises a plurality of differential amplifiers.

* * * * *